United States Patent
Szu

[19]

[11] Patent Number: 6,116,923
[45] Date of Patent: Sep. 12, 2000

[54] ELECTRICAL CONNECTOR

[75] Inventor: Ming-Lun Szu, Taipei, Taiwan

[73] Assignee: Hon Hai Precision Ind. Co., Ltd., Taipei Hsien, Taiwan

[21] Appl. No.: 09/362,918

[22] Filed: Jul. 27, 1999

[30] Foreign Application Priority Data

Dec. 18, 1998 [TW] Taiwan ................................. 87221132

[51] Int. Cl.⁷ ............................................. H01R 9/09
[52] U.S. Cl. ............................................. 439/83; 439/70
[58] Field of Search ....................... 439/83, 70, 71, 439/876

[56] References Cited

U.S. PATENT DOCUMENTS

| | | |
|---|---|---|
| 5,279,028 | 1/1994 | McKee et al. .......................... 439/876 |
| 5,475,317 | 12/1995 | Smith ........................................ 439/71 |
| 5,591,941 | 1/1997 | Acocella et al. ........................... 439/83 |
| 5,593,322 | 1/1997 | Swamy et al. ............................. 439/83 |
| 5,691,041 | 11/1997 | Frankeny et al. ......................... 439/71 |
| 5,895,281 | 4/1999 | Rothenberger ............................ 439/83 |

*Primary Examiner*—Gary F. Paumen
*Attorney, Agent, or Firm*—Wei Te Chung

[57] ABSTRACT

An electrical connector for interconnecting a CPU or a chipset to a printed circuit board comprises a housing, a number of terminals received in the housing and a number of solder blocks. Each terminal has a base and a tail pad perpendicularly extending from the base. Each solder block is rectangular and mounted on the tail pad of the corresponding terminal by a plane contact to increase a contact area existing therebetween for promoting manufacturing efficiency and enhancing the securement of the solder block to the terminal.

6 Claims, 5 Drawing Sheets

ELECTRICAL CONNECTOR

BACKGROUND OF THE INVENTION

1. Field of the Invention

The present invention relates to an electrical connector, and particularly to an electrical connector for electrically connecting a chipset to a printed circuit board.

2. Description of Prior Art

Generally, a conventional electrical connector for electrically connecting a chipset to a printed circuit board (PCB) is attached to the PCB by surface mounting terminals thereof. Before the electrical connector is attached to the PCB, a solder ball is pre-welded to a tail of each terminal for contacting with a corresponding soldering pad on the PCB. Example of such connectors are disclosed in Taiwan Patent Application Nos. 83112323 and 84107758.

Referring to FIG. 1A, a solder ball 5 is pre-welded to a tail 7 of a terminal 9 of an electrical connector.

Referring to FIG. 1B, a terminal 9 has a right-angled tail 7' for being pre-welded with a solder ball 5. However, due to a limited contact area between the solder ball 5 and the tail 7 or 7' of the terminal 9, the solder ball 5 may become easily detached after being pre-welded to the terminal tail 7 or 7'. In addition, due to the shape of the solder ball 5, properly positioning the solder ball 5 on the tail 7 or 7' of the terminal 9 is difficult. Furthermore, conventionally, the process of pre-welding the solder balls is performed after the electrical connector is assembled. Thus, efficiency of the manufacturing process is not promoted.

SUMMARY OF THE INVENTION

Accordingly, an object of the present invention is to provide an electrical connector having terminals to be pre-welded with a solder block for promoting manufacturing efficiency and enhancing the securement of the solder block to the terminal.

In the preferred embodiment of the present invention, an electrical connector for interconnecting a CPU or a chipset to a printed circuit board, comprises a housing, a plurality of terminals received in the housing and a plurality of solder blocks. Each terminal has a base and a tail pad perpendicularly extending from the base. Each solder block is rectangular and attached to the tail pad of the corresponding terminal by a plane contact to increase a contact area existing therebetween.

BRIEF DESCRIPTION OF THE DRAWINGS

Other objects and advantages of the present invention will be understood from the following description of an electrical connector according to preferred embodiments of the present invention as shown in the accompanying drawings, in which.

DETAILED DESCRIPTION OF THE PREFERRED EMBODIMENT

Figure 1A:
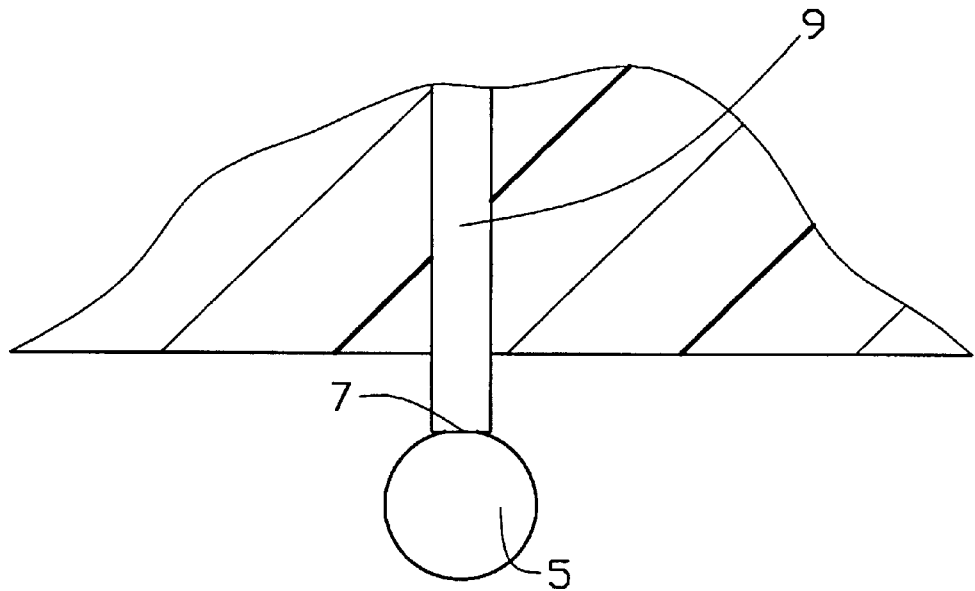
FIG. 1A is a partial, cross-sectional view of a conventional electrical connector showing a solder ball pre-welded to a terminal thereof.
Figure 1B:
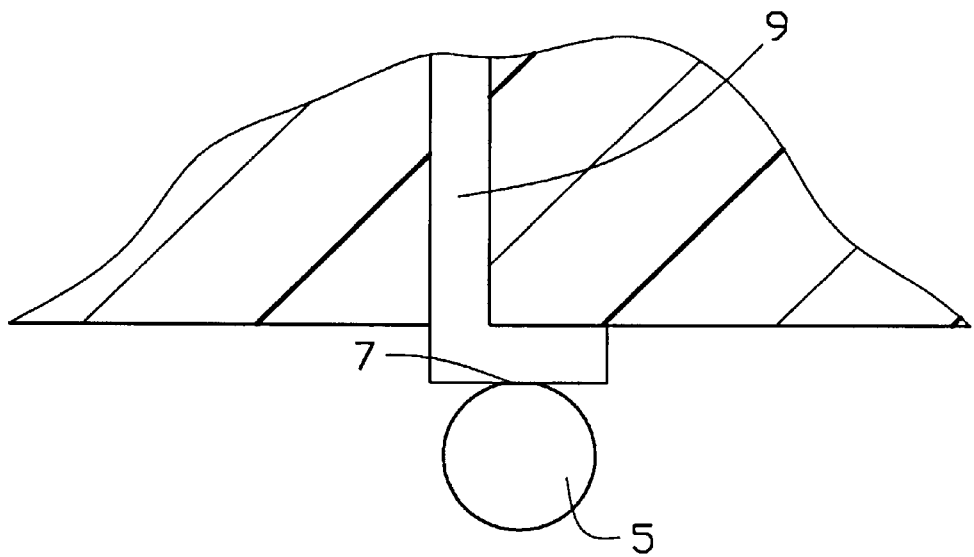
FIG. 1B is a view similar to FIG. 1A but showing a conventional electrical connector having a different terminal.

For facilitating understanding, like components are designated by like reference numerals in the different embodiments as shown in the various drawing figures.

Figure 2:
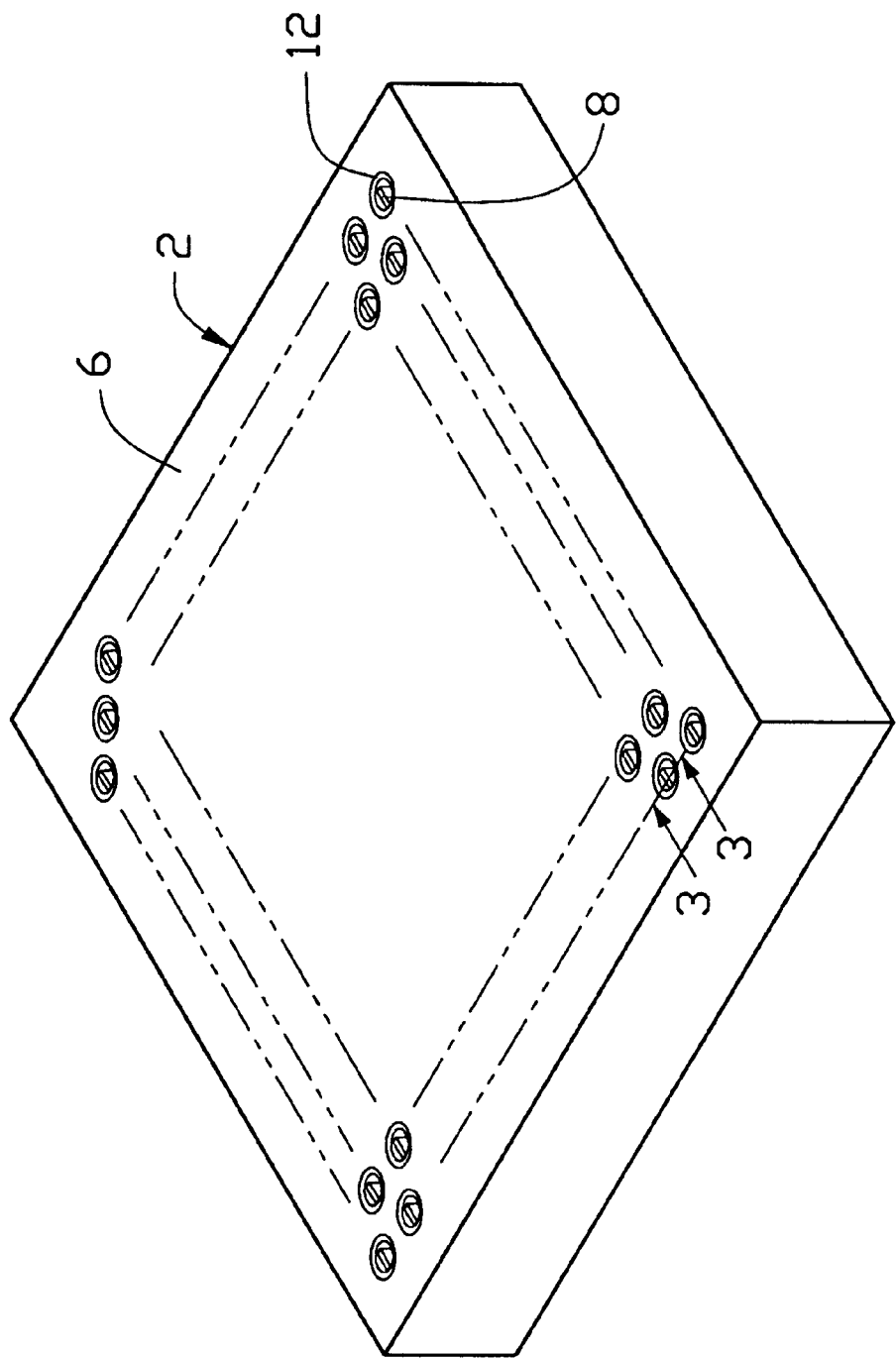
FIG. 2 is a perspective view of an electrical connector embodying the concepts of the present invention.
Figure 3:
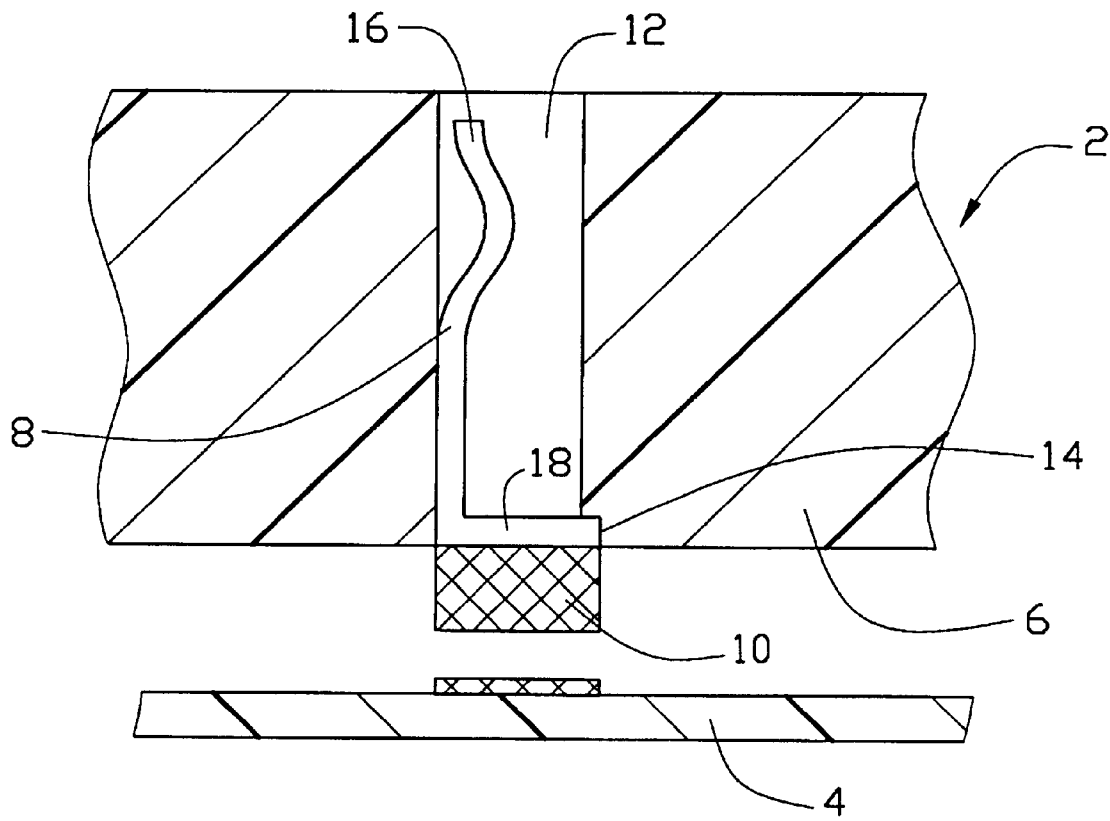
FIG. 3 is a cross sectional view taken along 3—3 of FIG. 2 and showing a PCB.
Figure 4:
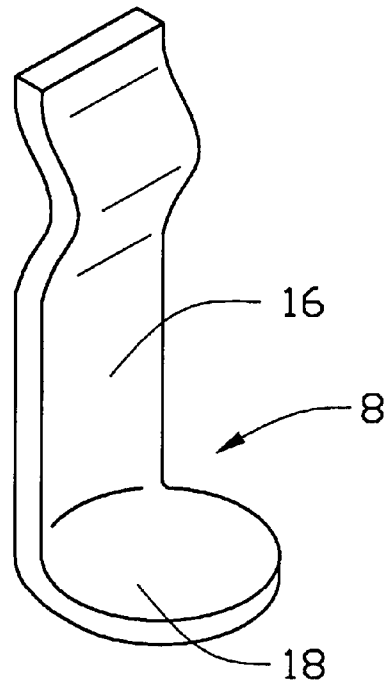
FIG. 4 is a perspective view of a terminal in accordance with a first embodiment of the present invention.

Referring to FIGS. 2, 3 and 4, an electrical connector 2 in accordance with the present invention for being mounted to a printed circuit board (PCB) 4 and mating with a CPU or a chipset (not shown) includes a housing 6, a plurality of terminals 8 and a plurality of solder blocks 10 mounted on the terminals 8. The housing 6 defines a plurality of receiving holes 12 for receiving the terminals 8 therein. A shoulder 14 is formed in each receiving hole 12 and faces the PCB 4.

Each terminal 8 includes a base 16 and a tail pad 18 perpendicularly extending from the base 16. The tail pad 18 is shaped to be a round plate and abuts against the shoulder 14 for ensuring the planarity thereof to properly mount the solder block 10 thereto. The solder block 10 is rectangular. The contact area between the solder block 10 and the tail pad 18 is large thereby ensuring the reliability of the solder block 10 mounted thereto. Furthermore, since the solder block 10 is rectangular, proper position between the solder block 10 and the tail pad 18 of the terminal 8 can be easily achieved. Additionally, the solder block 10 can be mounted to the tail pad 18 after the terminal 8 is stamped thereby promoting an efficient manufacturing process.

Figure 5:
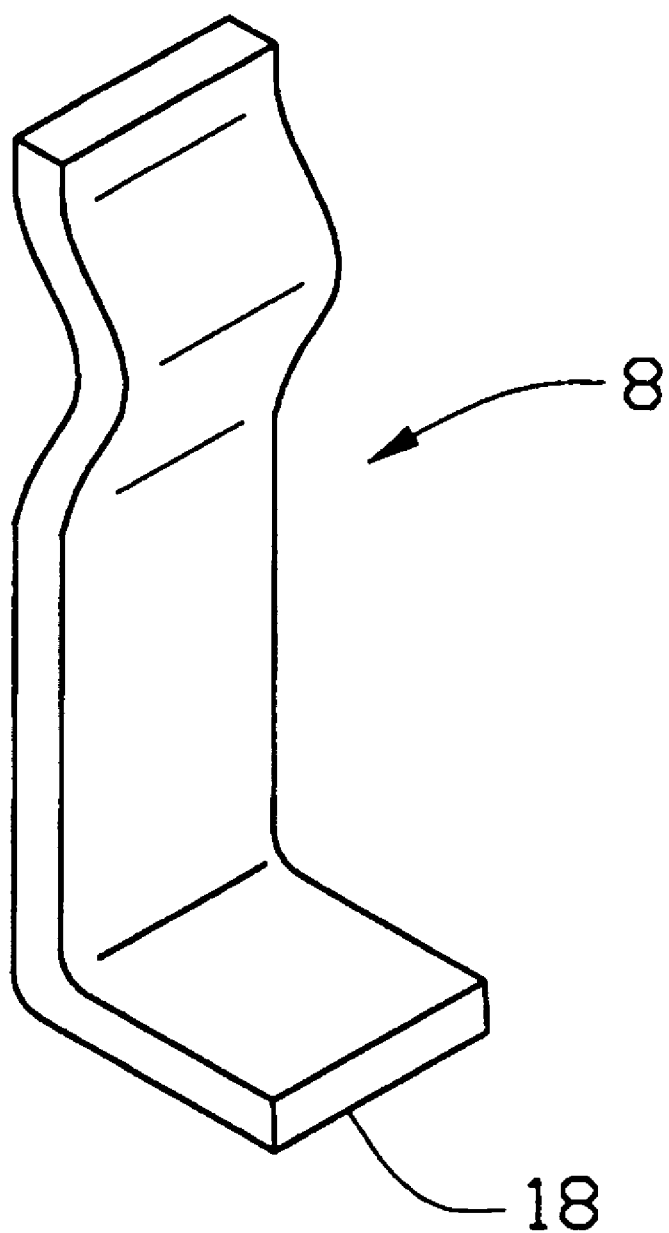
FIG. 5 is a perspective view of a terminal in accordance with a second embodiment of the present invention.

Referring to FIG. 5, a tail pad 18' of the terminal 8 in accordance with a second embodiment of the present invention is a rectangular plate.

Figure 6:
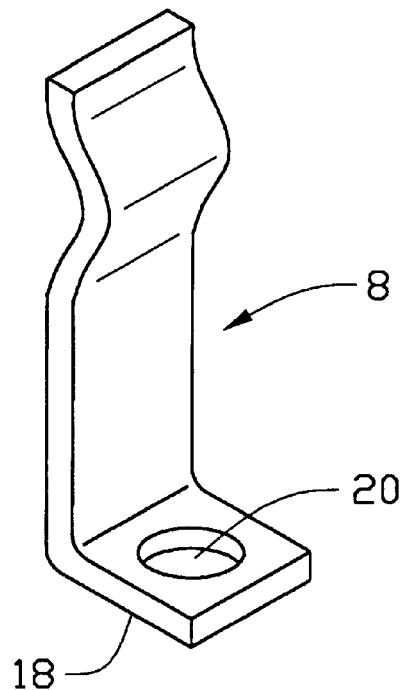
FIG. 6 is a perspective view of a terminal in accordance with a third embodiment of the present invention.

Referring to FIG. 6, a tail pad 18" of the terminal 8 in accordance with a third embodiment of the present invention defines an opening 20 therein for enhancing the reliability of the solder block 10 mounted thereto.

Figure 7:
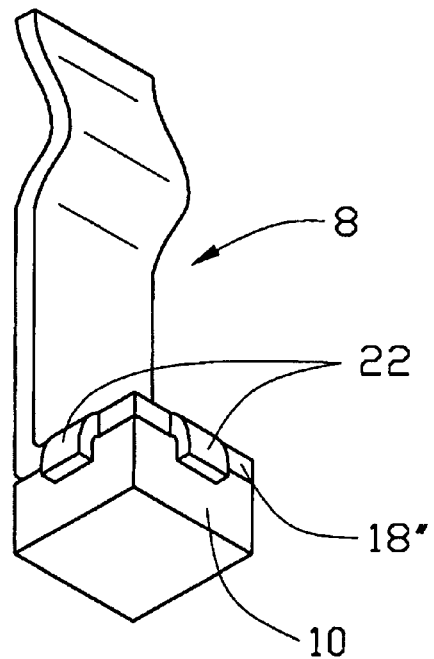
FIG. 7 is a perspective view of a terminal in accordance with a fourth embodiment of the present invention.

Referring to FIG. 7, a tail pad 18''' of the terminal 8 in accordance with a fourth embodiment of the present invention forms a plurality of tabs 22 downwardly extending from edges thereof for engaging with the solder block 10 thereby enhancing the reliability of the solder block 10 mounted thereto.

It will be understood that the present invention may be embodied in other specific forms without departing from the spirit of the central characteristics thereof. The present examples and embodiments, therefore, are to be considered in all respects as illustrative and not restrictive, and the invention is not to be limited to the details given herein.

What is claimed is:

1. An electrical connector for interconnecting a chipset to a printed circuit board, comprising:

a housing;

a plurality of terminals received in the housing, each terminal having a base and a tail pad perpendicularly extending from the base; and a rectangular solder block attached to each tail pad of the terminals by planar contact therebetween.

2. The electrical connector as described in claim 1, wherein the tail pad of each terminal is round.

3. The electrical connector as described in claim 1, wherein the tail pad of each terminal is rectangular.

4. The electrical connector as described in claim 1, wherein each tail pad defines an opening therein for enhancing the securement of the solder block to the tail pad.

5. The electrical connector as described in claim 1, wherein each tail pad forms a plurality of tabs downwardly extending from edges thereof for engaging with the corresponding solder block thereby enhancing the securement of the solder block to the tail pad.

6. An electrical connector for interconnecting a chipset to a printed circuit board, comprising:

an insulative housing;

a plurality of terminals received within the housing, each of said terminals having a base and a tail pad perpendicularly extending from the base;

a plurality of, rectangular solder blocks mechanically attached to an undersurface of the corresponding tail pads, respectively.

\* \* \* \* \*